US008619236B2

(12) United States Patent
Bruce et al.

(10) Patent No.: US 8,619,236 B2
(45) Date of Patent: Dec. 31, 2013

(54) DETERMINING LITHOGRAPHIC SET POINT USING OPTICAL PROXIMITY CORRECTION VERIFICATION SIMULATION

(75) Inventors: James A. Bruce, Williston, VT (US); Edward W. Conrad, Jeffersonville, VT (US); Jacek G. Smolinski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 371 days.

(21) Appl. No.: 12/953,511

(22) Filed: Nov. 24, 2010

(65) Prior Publication Data

US 2012/0127442 A1 May 24, 2012

(51) Int. Cl.
G03B 27/32 (2006.01)
G03B 27/68 (2006.01)
G03B 27/52 (2006.01)
G03B 27/42 (2006.01)

(52) U.S. Cl.
USPC .................. 355/77; 355/52; 355/53; 355/55

(58) Field of Classification Search
USPC ................ 355/52, 53, 55, 72, 75, 77, 67–71; 250/492.1, 492.2, 492.22, 548; 430/5, 430/8, 22, 30, 311, 312, 321; 716/52, 53, 716/54, 55, 110–112; 382/144; 700/97, 700/110, 121
See application file for complete search history.

(56) References Cited

U.S. PATENT DOCUMENTS

| 5,800,951 A | 9/1998 | Hashimoto |
| 6,067,375 A * | 5/2000 | Tsudaka ........................ 382/144 |
| 6,106,980 A | 8/2000 | Pierrat et al. |
| 6,187,687 B1 | 2/2001 | Plat et al. |
| 6,415,421 B2 | 7/2002 | Anderson et al. |
| 6,425,117 B1 | 7/2002 | Pasch et al. |
| 6,600,551 B2 | 7/2003 | Cooper et al. |
| 6,606,533 B1 | 8/2003 | Whiting |
| 6,665,856 B1 * | 12/2003 | Pierrat et al. ..................... 716/53 |
| 6,766,507 B2 * | 7/2004 | Bruce et al. ..................... 716/51 |
| 6,888,616 B2 | 5/2005 | Cooper et al. |

(Continued)

FOREIGN PATENT DOCUMENTS

JP 2009139632 A 6/2009

OTHER PUBLICATIONS

Lin: U.S. Appl. No. 13/014,159, filed Jan. 26, 2011, Notice of Allowance, Jan. 11, 2013, 5 pgs.

(Continued)

*Primary Examiner* — Toan Ton
*Assistant Examiner* — Christina Riddle
(74) *Attorney, Agent, or Firm* — Katherine Brown; Hoffman Warnick LLC

(57) ABSTRACT

The subject matter disclosed herein relates to determining a lithographic set point using simulations of optical proximity correction verification. In one embodiment, a computer-implemented method of determining a lithographic tool set point for a lithographic process is disclosed. The method may include: providing a model of a production lithographic process including simulations of printed shapes; analyzing the model of the production lithographic process to determine whether a set of structures on a production mask used in the production lithographic process to create the printed shapes will fail under a plurality of set points; determining an operating region of set points where the set of structures on the production mask does not fail; and establishing a set point location within the operating region based upon a set point selection function.

11 Claims, 10 Drawing Sheets

(56) References Cited

U.S. PATENT DOCUMENTS

| | | |
|---|---|---|
| 6,952,818 B2 | 10/2005 | Ikeuchi |
| 7,065,738 B1 | 6/2006 | Kim |
| 7,093,229 B2 | 8/2006 | Pang et al. |
| 7,114,145 B2 | 9/2006 | Ye et al. |
| 7,233,887 B2 | 6/2007 | Smith |
| 7,245,356 B2 | 7/2007 | Hansen |
| 7,264,906 B2 | 9/2007 | Croffie et al. |
| 7,281,222 B1 | 10/2007 | Babcock |
| 7,318,214 B1 | 1/2008 | Prasad et al. |
| 7,325,222 B2 | 1/2008 | Strelkova et al. |
| 7,350,183 B2 | 3/2008 | Cui et al. |
| 7,383,530 B2 | 6/2008 | Wang et al. |
| 7,480,890 B2 | 1/2009 | Hsiao |
| 7,587,704 B2 | 9/2009 | Ye et al. |
| 7,617,477 B2 | 11/2009 | Ye et al. |
| 7,624,369 B2 | 11/2009 | Graur et al. |
| 7,646,906 B2 | 1/2010 | Saidin et al. |
| 7,689,966 B2 | 3/2010 | Verma et al. |
| 7,694,267 B1 | 4/2010 | Ye et al. |
| 7,695,876 B2 | 4/2010 | Ye et al. |
| 7,752,595 B2 | 7/2010 | Maeda et al. |
| 7,805,699 B2* | 9/2010 | Kusnadi et al. ............ 716/51 |
| 7,941,768 B1* | 5/2011 | Wei .............................. 716/54 |
| 8,014,991 B2 | 9/2011 | Mitrovic et al. |
| 8,057,967 B2 | 11/2011 | Ye et al. |
| 8,200,468 B2 | 6/2012 | Ye et al. |
| 2003/0219154 A1* | 11/2003 | Medvedeva et al. ........ 382/144 |
| 2004/0268291 A1* | 12/2004 | Alvarez-Gomariz et al. .. 716/21 |
| 2005/0055658 A1* | 3/2005 | Mukherjee et al. .......... 716/19 |
| 2006/0250589 A1* | 11/2006 | Eurlings et al. ............. 355/52 |
| 2007/0031745 A1 | 2/2007 | Ye et al. |
| 2007/0113216 A1* | 5/2007 | Zhang .......................... 716/17 |
| 2007/0292778 A1 | 12/2007 | Bang et al. |
| 2008/0204690 A1 | 8/2008 | Berger et al. |
| 2009/0031262 A1 | 1/2009 | Maeda et al. |
| 2009/0123057 A1* | 5/2009 | Mukherjee et al. .......... 382/144 |
| 2009/0132992 A1 | 5/2009 | Zhou et al. |
| 2009/0157360 A1 | 6/2009 | Ye et al. |
| 2009/0246975 A1 | 10/2009 | Lin et al. |
| 2009/0265680 A1* | 10/2009 | Izuha et al. .................. 716/21 |
| 2010/0122225 A1 | 5/2010 | Cao et al. |
| 2010/0162197 A1* | 6/2010 | Ye et al. ....................... 716/21 |
| 2010/0175042 A1 | 7/2010 | Tirapu Azpiroz et al. |
| 2010/0180251 A1 | 7/2010 | Ye et al. |
| 2012/0191234 A1 | 7/2012 | Bruce et al. |

OTHER PUBLICATIONS

Lin: U.S. Appl. No. 13/014,159, filed Jan. 26, 2011, ExParteQuayle, Oct. 12, 2012, 14 pgs.

Rodrigues et al., "Optical Lithography Simulation with Focus Variation using Wavelet Transform", IEEE, 2010.

Sturtevant et al., "Novel Method for Optimizing Lithography Exposure Conditions using Full-Chip Post-OPC Simulation", Optical Microlithography XXI, 2008.

Word et al., "Lithography yield enhancement through optical rule checking", Advanced Microlithography Technologies, 2005.

Jank et al, "Method for fast and accurate calibration of litho simulator for hot spot analysis", PE-82.

Anderson et al., "Optimizing orocess window robustness with reconfigurable OPC (reconfigurable optical proximity correction)", Solid State Technology 2006.

Ban et al., "A Fast Lithography Verification Framework for Litho-Friendly Layout Design", Proceedings of the Sixth International Symposium on Quality Electronic Design, 2005.

Hung et al., "Post-OPC verification using a full-chip Pattern-Based simulation verification method", 25th Annual BACUS Symposium on Photomask Technology, 2005.

Lucas, et al., Patterning control budgets for the 32nm generation incorporating lithography, design, and RET variations, Optical Microlithography XX, Proc. of SPIE, vol. 6520, 65200N, 2007.

Zach et al., "Process dependencies of Optical Proximity Corrections", Optical Microlithography XIV, Proceedings of SPIE vol. 4346, 2001.

Masinick: U.S. Appl. No. 13/014,152, Office Action Mar. 12, 2013, 18 pages.

Masinick, Notice of Allowance and Fee(s) Due for U.S. Appl. No. 13/014,152 dated Jun. 26, 2013, 12 pages.

* cited by examiner

DETERMINING LITHOGRAPHIC SET POINT USING OPTICAL PROXIMITY CORRECTION VERIFICATION SIMULATION

BACKGROUND OF THE INVENTION

The subject matter disclosed herein relates to determining a lithographic set point using simulations of optical proximity correction verification. More specifically, the subject matter disclosed herein relates to defining an acceptable operating region for a lithography process by iteratively modifying process conditions used in optical proximity correction (OPC) verification simulation.

Photomasks and reticles (hereinafter, "photomasks" or "masks") are used in photolithography with an exposure source to cast images in photoimageable films such as photoresists. Masks typically are partially transparent and partially opaque, often having a transparent quartz substrate with chrome metal patterns defining the opaque patterns thereon. The design of a mask may be a complicated process. In order to correctly pattern the photoimageable film, the opaque features of the mask need to appear different from the patterns intended to be achieved in the photoimageable film. This arises because optical proximity effects upon the photolithographic exposure of nearby features must be compensated. As examples of optical proximity effects, lines on the mask can appear shorter when printed on the photoimageable film, and lines which are isolated (features which are not near other neighboring features) tend to shrink in width as they appear in the exposed photoimageable film. On the other hand, lines which are "nested", that is, lines which lie between other neighboring lines, tend not to shrink as much as isolated lines.

Existing techniques for verifying the suitability of a mask or reticle for the photolithographic process can become computationally intensive, particularly when masks need to be verified for marginal exposure conditions, i.e., non-optimum focus and dose conditions. The process of verifying a mask involves determining whether the shapes on the mask will produce the desired exposure pattern in the photoimageable layer. As semiconductor chips can now contain several billion transistors per chip, the processing required to completely verify a photomask can take several days or even weeks to perform, even when significant computing resources are devoted to the task.

BRIEF SUMMARY OF THE INVENTION

Solutions for determining a lithographic set point using simulations of optical proximity correction verification are disclosed. In one embodiment, a computer-implemented method of determining a lithographic tool set point for a lithographic process is disclosed. The method may include: providing a model of a production lithographic process including simulations of printed shapes; analyzing the model of the production lithographic process to determine whether a set of structures on a production mask used in the production lithographic process to create the printed shapes will fail under a plurality of set points; determining an operating region of set points where the set of structures on the production mask does not fail; and establishing a set point location within the operating region based upon a set point selection function.

A first aspect may include a computer-implemented method of determining a lithographic tool set point for a lithographic process, the method including: providing a model of a production lithographic process including simulations of printed shapes; analyzing the model of the production lithographic process to determine whether a set of structures on a production mask used in the production lithographic process to create the printed shapes will fail under a plurality of set points; determining an operating region of set points where the set of structures on the production mask does not fail; and establishing a set point location within the operating region based upon a set point selection function.

A second aspect may include a computer system including: at least one computing device configured to determine a lithographic tool set point for a lithographic process by performing actions comprising: providing a model of a production lithographic process including simulations of printed shapes; analyzing the model of the production lithographic process to determine whether a set of structures on a production mask used in the production lithographic process to create the printed shapes will fail under a plurality of set points; determining an operating region of set points where the set of structures on the production mask does not fail; and establishing a set point location within the operating region based upon a set point selection function.

A third aspect may include a computer program having program code embodied in at least one computer-readable storage medium, which when executed, enables a computer system to implement a method for determine a lithographic tool set point for a lithographic process, the method including: providing a model of a production lithographic process including simulations of printed shapes; analyzing the model of the production lithographic process to determine whether a set of structures on a production mask used in the production lithographic process to create the printed shapes will fail under a plurality of set points; determining an operating region of set points where the set of structures on the production mask does not fail; and establishing a set point location within the operating region based upon a set point selection function.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated herein, semiconductor chips can now contain several billion transistors per chip. Accordingly, the processing required to completely verify a photomask can take several days or even weeks to perform, even when significant computing resources are devoted to the task.

The subject matter disclosed herein relates to defining an acceptable operating region for a lithography process by iteratively modifying process conditions used in optical proximity correction (OPC) verification simulation to generate post-OPC data, and running OPC verification on the post-OPC data. In one embodiment, the subject matter disclosed herein relates to a computer-implemented method comprising: providing a model of a production lithographic process including simulations of printed shapes; analyzing the model of the production lithographic process to determine whether a set of structures (e.g., two or more structures) on a production mask used in the production lithographic process to create the printed shapes will fail under a plurality of set points; determining an operating region of set points where the set of structures on the production mask does not fail; and establishing a set point location within the operating region based upon a set point selection function.

Figure 1:
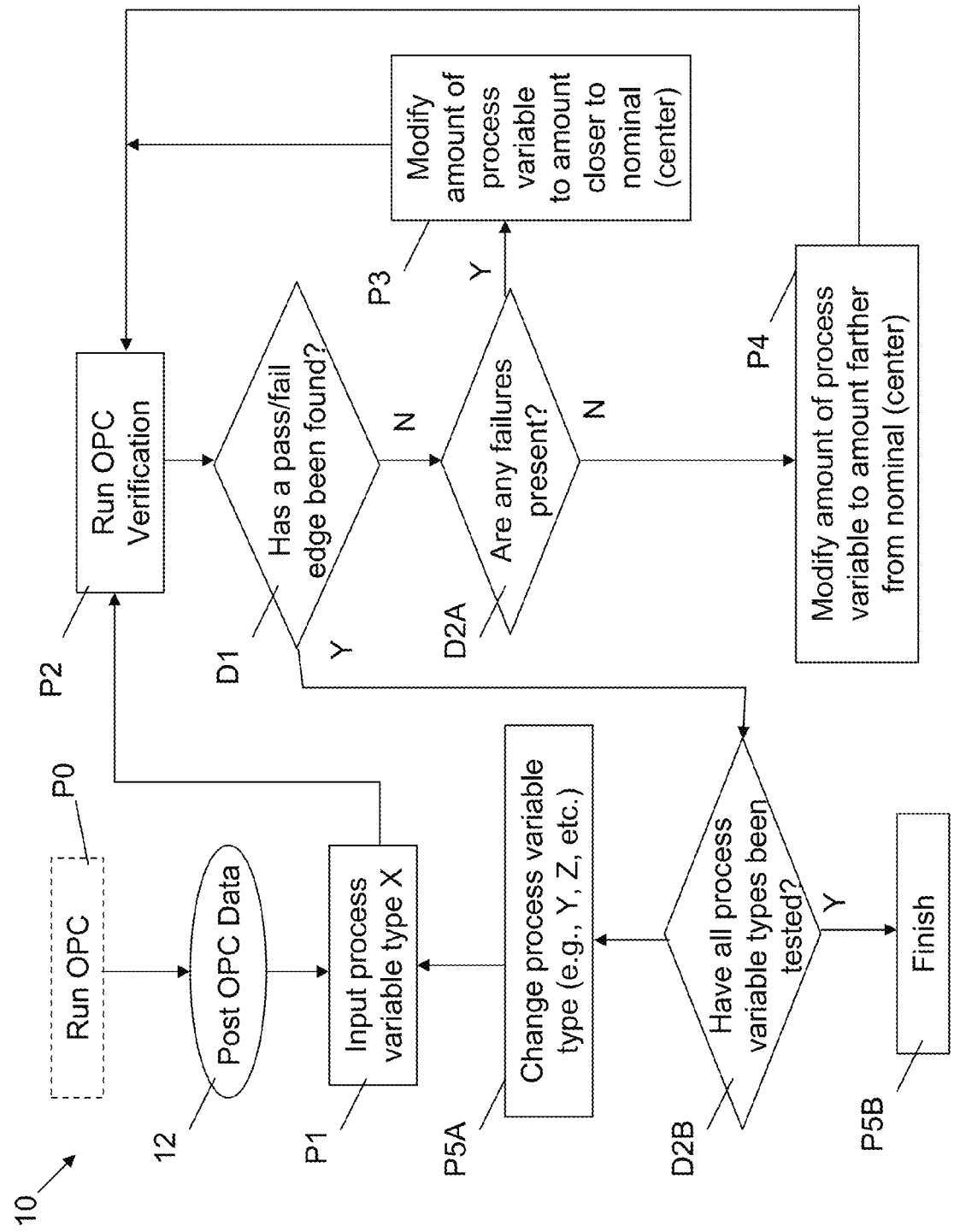
FIG. 1 shows a flow chart illustrating a method according to embodiments.

Turning to FIG. 1, a flow chart 10 is shown illustrating a general method according to embodiments. In optional process P0 (in that it is optionally performed along with the methods described herein), optical proximity correction (OPC) is run on a mask design to generate post-OPC data 12. As is known in the art, post-OPC data 12 may include "mask ready" data (shapes) including additional features designed to account for inconsistencies in the exposure process. Further detail on the contents of post-OPC data 12 is omitted herein for brevity.

Processes P1-P2 collectively include choosing a first process variable type (X), and running optical proximity correction verification (OPC verification) for that process variable on the post OPC data 12. A non-exhaustive list of process variables includes: positive (+) dose, negative (−) dose, positive (+) focus, negative (−) focus, combined + dose and − focus, combined − dose and + focus, combined + dose and + focus, combined − dose and − focus, etc. It is understood that in some cases, each of the aforementioned process variables may have distinct and/or disproportionate affects on the OPC verification process (P2). That is, for example, an incremental increase in + dose may have a greater or lesser affect on the OPC verification process than an equally incremental increase in − dose. This may be the case because a first process variable (e.g., + dose) may cause a different failure than a second process variable (e.g., − dose). In any case, process P1 includes choosing a process variable (e.g., + dose, − dose, etc.) and process P2 includes running OPC verification for the chosen process variable type X. As is known in the art, OPC verification may help to identify any potential failures in the (modified) structures defined in the OPC data 12.

In decision D1, OPC verification indicates whether a pass/fail edge has been found. A pass/fail edge may be defined as a process variable value (e.g., + dose value) at the edge of an acceptable operating range (or, region), within a certain predetermined tolerance. In the case that a pass/fail edge has not been found (No to decision D1), in decision D2A, it is determined whether any failures are present for this process variable (e.g., + dose). That is, in decision D2A, the presence of any failure point(s) for a process variable type X (e.g., + dose) is determined. In the case that a failure point is found (Yes to decision D2A), then process P3 may follow, where an amount of a process variable (e.g., + dose) is modified to approach a point closer to the nominal (or, center) point. In a sense, process P3 may establish a preliminary "outer" bound for the process variable in the model. Following the modification of the amount of process variable type X, process P2 (OPC verification) may be repeated, along with subsequent decisions and processes described herein.

Returning to decision D2A, in the case that no failures are present (No to decision D2A), then the process may flow to process P4, where an amount of a process variable (e.g., + dose) is modified to approach a point farther from the nominal (or, center) point. In a sense, process P4 may establish a preliminary "inner" bound for the process variable in the model. That is, the non-failing (or, passing) point found in decision D2A may act as a preliminary innermost defining point of a yet-to-be determined pass/fail edge. As will be described further herein, the passing point found in decisions D1-D2A may allow for running of OPC verification (process P2) using a process variable amount (amount of process variable type X) farther from the nominal point. Following the modification of the amount of process variable type X (farther from nominal), process P2 (OPC verification) may be repeated, along with subsequent decisions and processes described herein.

Returning to decision D1, in the case that a pass/fail edge has been found for process variable type X (Yes to decision D1), the method may include proceeding to decision D2B, where it is determined whether all process variable types (e.g., + dose, − dose, + focus, − focus, combinations, etc.) have been tested. In the case that all process variable types have not been tested (No to decision D2B), then in process P5A, the process variable type is changed (e.g., from X to Y, or Y to Z, etc.). As described herein, process variable types may include + dose, − dose, + focus, − focus, combinations of dose and focus, etc. It is understood that other process variables may also be introduced such as, e.g., mask bias. In any case, in process P5A, the type of process variable is modified, and the method starting from process P1 may be repeated using the new process variable type. In the case that all process variable types have been tested (Yes to decision D2B), then the method finishes at process P5B.

As can be seen from flow chart 10, embodiments may include iteratively modifying an amount of a process variable, and running OPC verification on the model data (with the modified process variable amount) in order to determine a pass/fail edge for that process variable in the operating area. Additionally, embodiments include performing the iterative modification across a plurality of process variables individually, as well as in combination. The following flow charts and data plots will further illustrate embodiments described with reference to flow chart 10.

Figure 2:
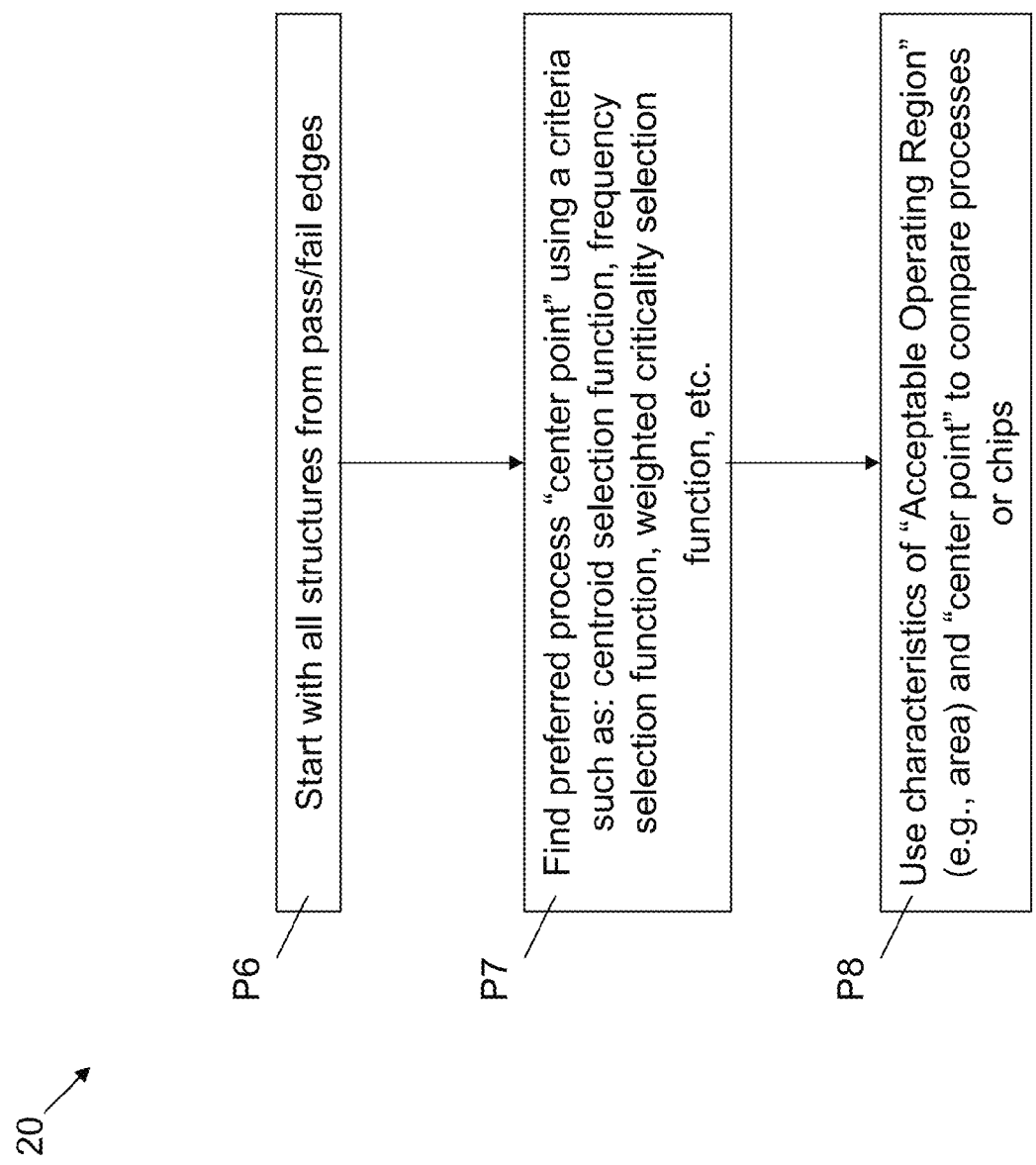
FIG. 2 shows a flow chart illustrating a method according to embodiments.

Turning to FIG. 2, a flow chart 20 is shown illustrating further steps in a process according to embodiments. Flow chart 20 starts with process P6, which may, in some cases, follow process P5B shown and described with reference to FIG. 1. Flow chart 20 may be performed after all structures (including "fail" and "pass" points) have been located. In process P6, all pass/fail edges may be located and data gathered in order to facilitate location of a preferred process "center point" in process P7. The preferred process center point may be determined by analyzing points along the pass/fail edges in accordance with one or more selection functions. In one embodiment, the selection functions may include: a centroid selection function, a frequency selection function or a weighted criticality selection function. The centroid selection function may determine a preferred process center point by finding a strictly central point within the pass/fail edge region (also known as the "acceptable" operating region). The frequency selection function may determine a preferred process center point by finding a location weighted in favor of a frequency of failure points or pass points. The weighted criticality selection function may determine a preferred process center point by finding a location weighted in favor of a criticality of failure points. In this case, the importance (criticality) of certain types of failures may be greater than others. For example, in some cases, + dose-related failures may be more critical than + focus-related failures. In this case, the weighted criticality selection function may determine a central point location that is shifted away from + dose failures. In another embodiment, criticality could also be determined by a geometric analysis (e.g. failures on isolated features are determined to be more critical than failures on dense features). In another embodiment, criticality could be determined by a circuit analysis (e.g. based on a designer's input indicating which circuits are the most critical, and which are less so).

In process P8, the acceptable operating region and determined process "center point" may be used to compare processes in forming structures (e.g., a set of two or more structures) or entire integrated circuits. For example, alternative OPC solutions (e.g., those generated by running OPC, as in process P0 on flow chart 10) could be evaluated, to find an OPC solution with the largest acceptable operating region. Similarly, this approach could be used to compare different lithographic processes, for example, changes in photoresists, or different RET processes (e.g. source illumination conditions or scattering bar presence/placement parameters).

Figure 3:
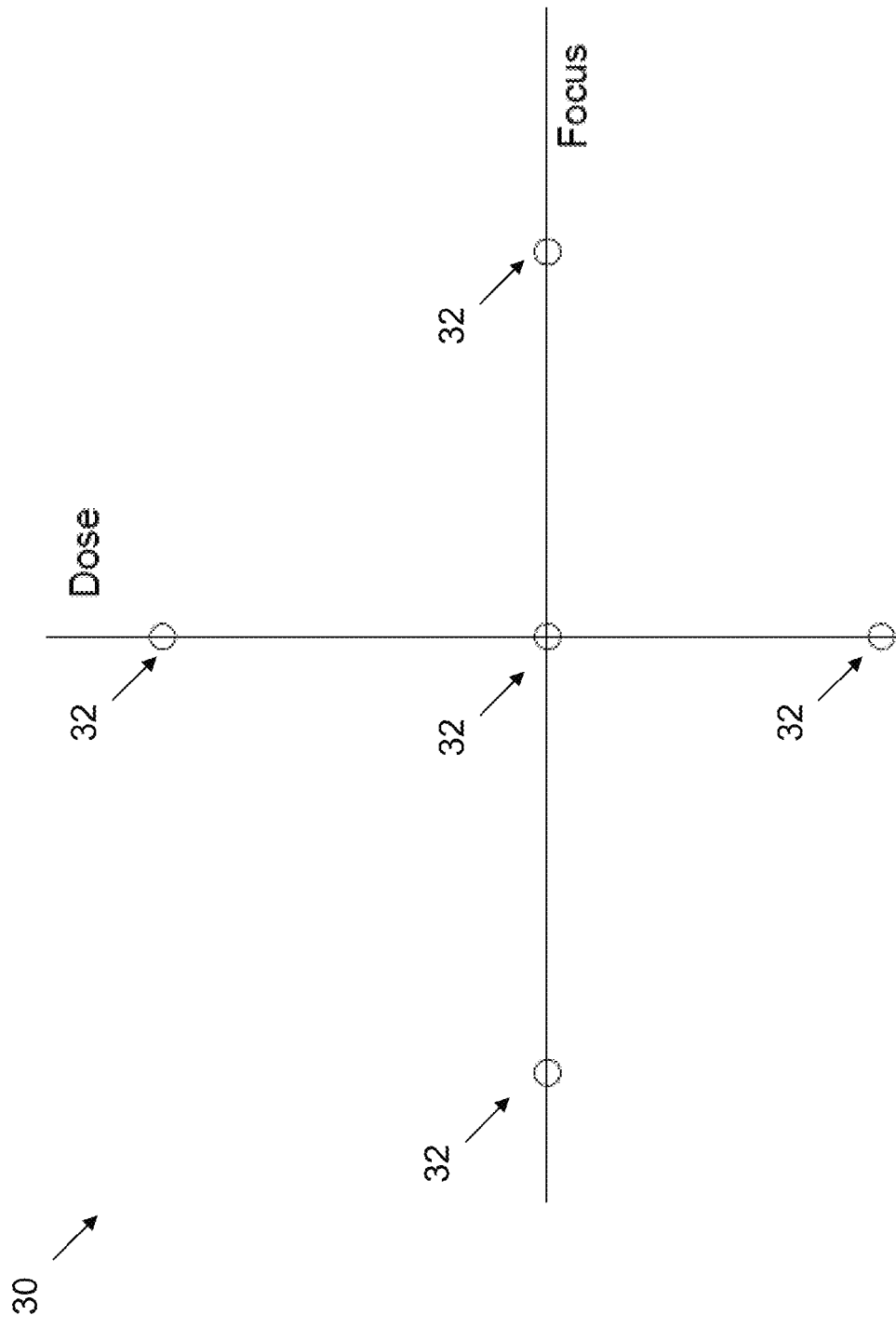
FIGS. 3-9 show examples of data plots illustrating portions of the methods of FIGS. 1-2.

The following example data plots further illustrate the processes and decisions described with reference to FIGS. 1-2:

FIG. 3 shows a data plot 30 illustrating example points 32 representing a set of process conditions, which may dictate the formation of one or more features within at least one structure in an integrated circuit (IC) layout. However, for the purposes of describing FIGS. 3-9, points 32 may represent the initial parameters for a given process variable. It is understood that the parameters represented by these points 32 may influence line widths, lengths, edge locations, spacing, etc. in a later-formed IC. These points 32 may indicate that a set of structures within the IC layout will pass or fail under desired lithography conditions. As shown, points 32 are illustrated along the Dose and Focus Axes, with one point 32 located at the intersection of the Dose/Focus Axes, where this intersection defines the nominal process condition.

Figure 4:
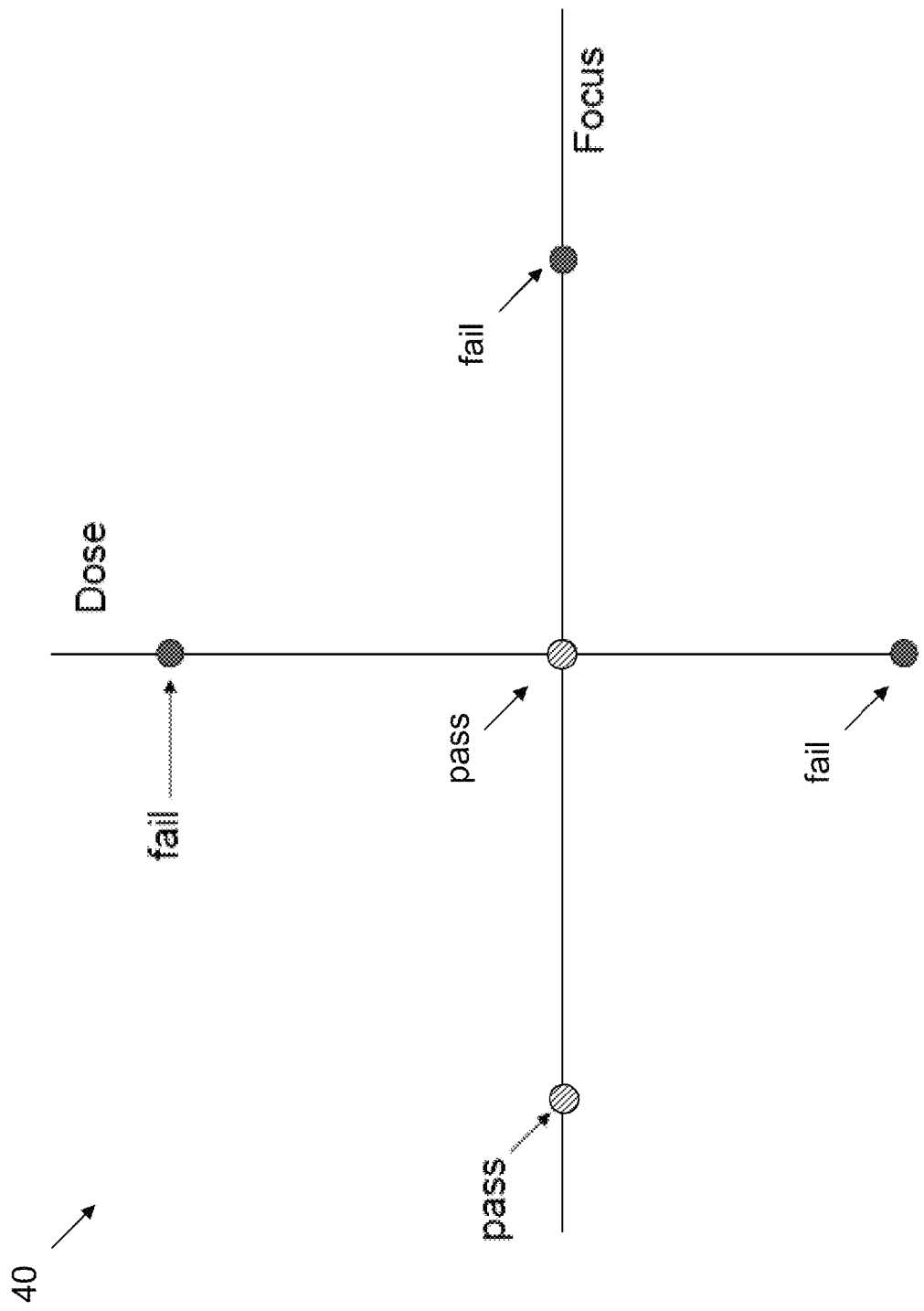

FIG. 4 shows a pass/fail data plot 40, indicating that certain points 32 from data plot 30 (FIG. 3) fail under OPC verification (process P2, FIG. 1). In this case, one point along the negative Focus Axis, and one point at the intersection of the Dose/Focus Axes (e.g., at the nominal dose/nominal focus location), respectively, pass OPC verification. Three points, one along the positive Dose Axis, one along the negative Dose Axis, and one along the positive Focus Axis, respectively, fail OPC verification. It is understood that the pass/fail analysis of these points may be performed in separate steps, as the process variables shown and described with reference to data plot 40 are distinct. However, for the purposes of illustration and brevity, multiple process variables (e.g., + dose, − dose, + focus, etc.) are shown in the data plots included herein.

Figure 5:
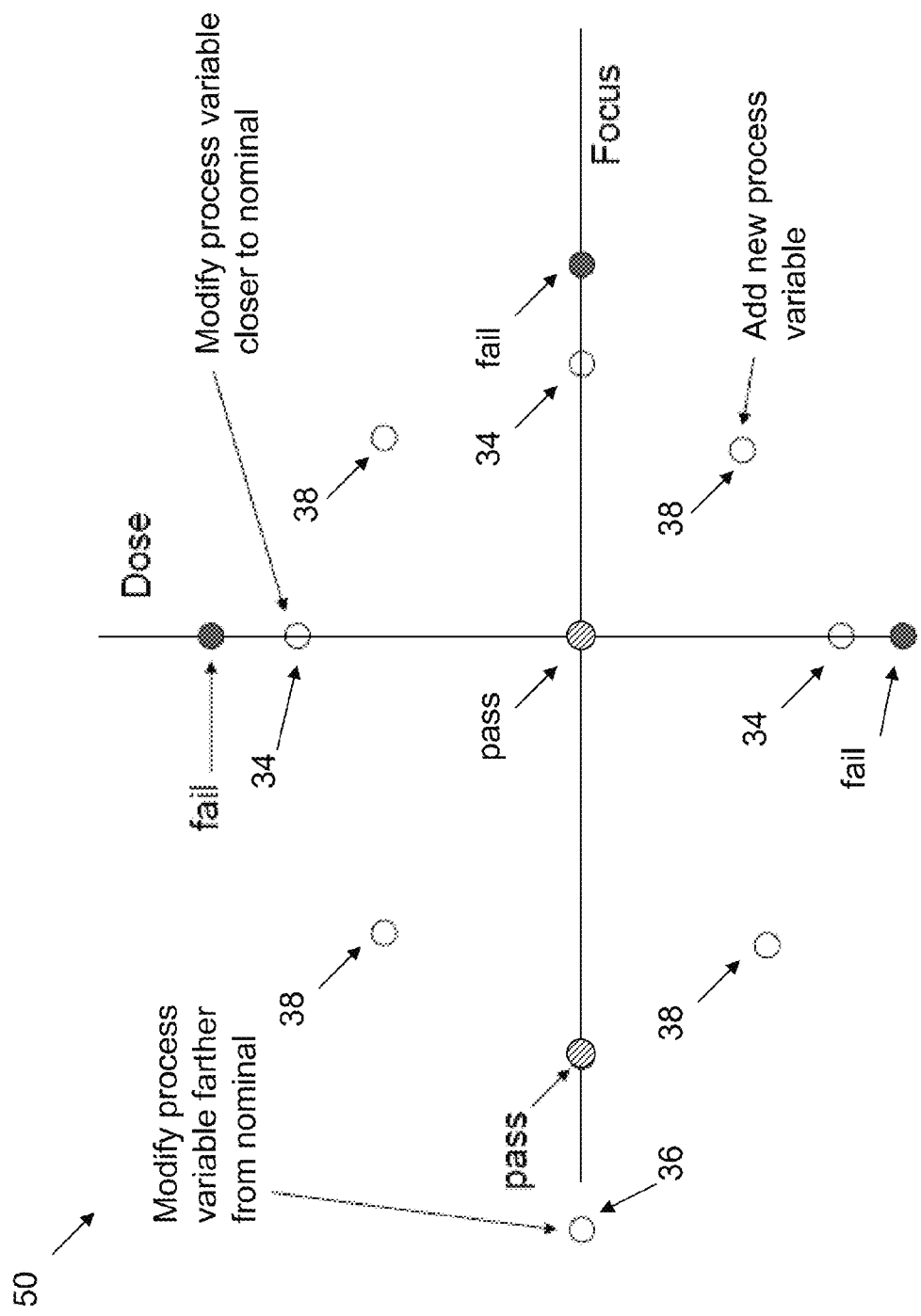
Figure 6:
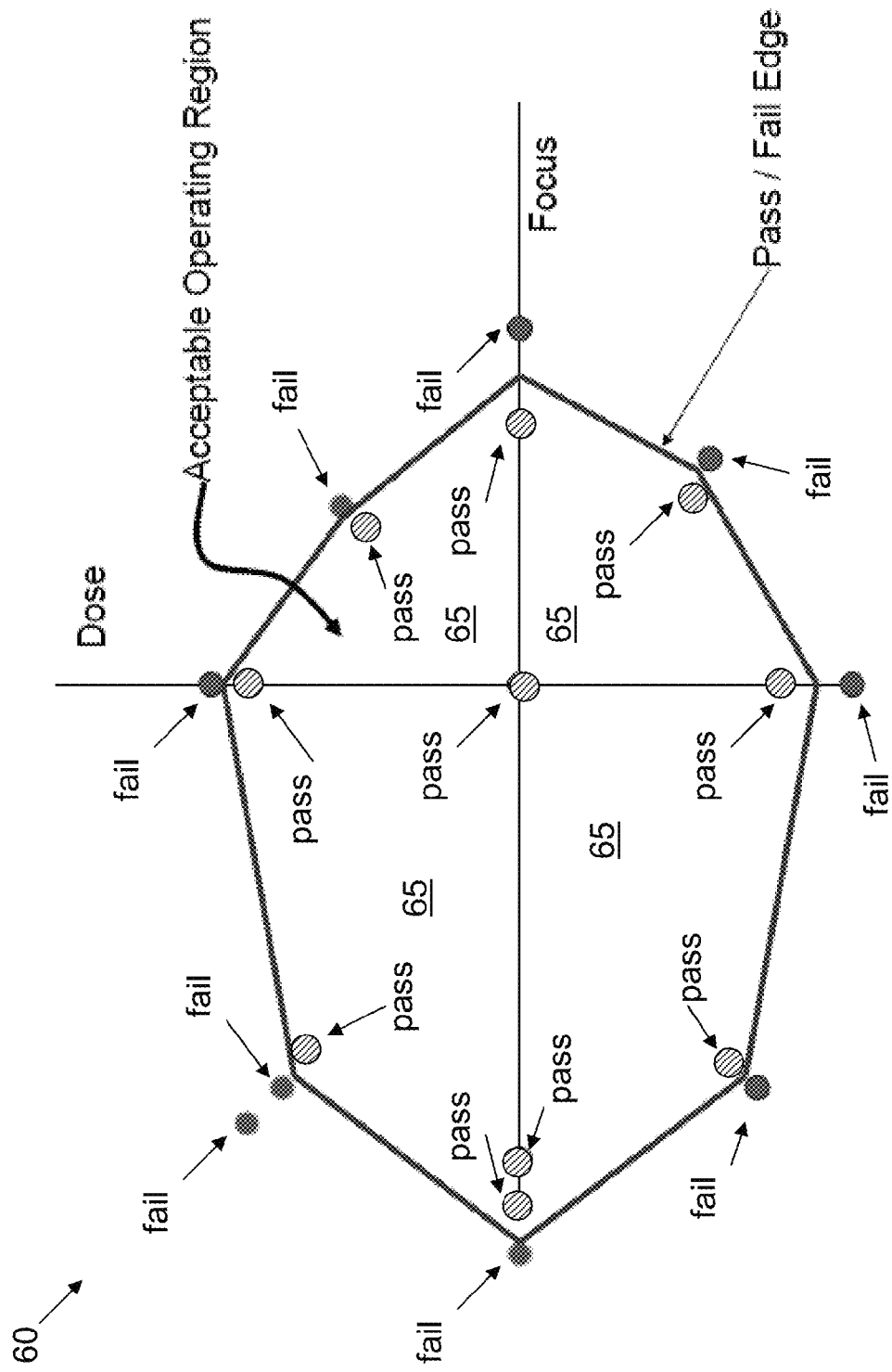

Turning to FIG. 5, a data plot 50 is shown including additional points (34, 36, 38) added to help define a pass/fail edge (FIG. 6). These additional points include points 34, which are closer to nominal than a fail point defined within a previously determined process variable. That is, points 34 are those closer to nominal along an axis (e.g., Dose, Focus) where a fail has occurred. Points 36 are those farther from nominal than a pass point defined within a previously determined process variable (e.g., along Dose or Focus Axes). Also shown are points 38, which represent additional process conditions for a yet-to-be tested process variable (e.g., combination of +dose/−focus, +dose/+focus, etc.). As described with reference to flow diagram 10 (FIG. 1), these points (34, 36, 38) may not all be determined simultaneously, however, in some embodiments, parallel OPC verification (process P2, FIG. 1) may be performed for a plurality of process variables.

FIG. 6 shows a data plot 60 including additional data points, some being fails and others being passes. Once adjacent locations of pass points and fail points are found, an "acceptable operating region" 65 may be defined. It is understood that the acceptable operating region 65 may generally define the area in which lithography tool may operate without experiencing a failure. As can be seen from FIG. 6, this acceptable operating region 65 may be asymmetric about an axis (e.g., Dose and/or Focus Axes).

Figure 7:
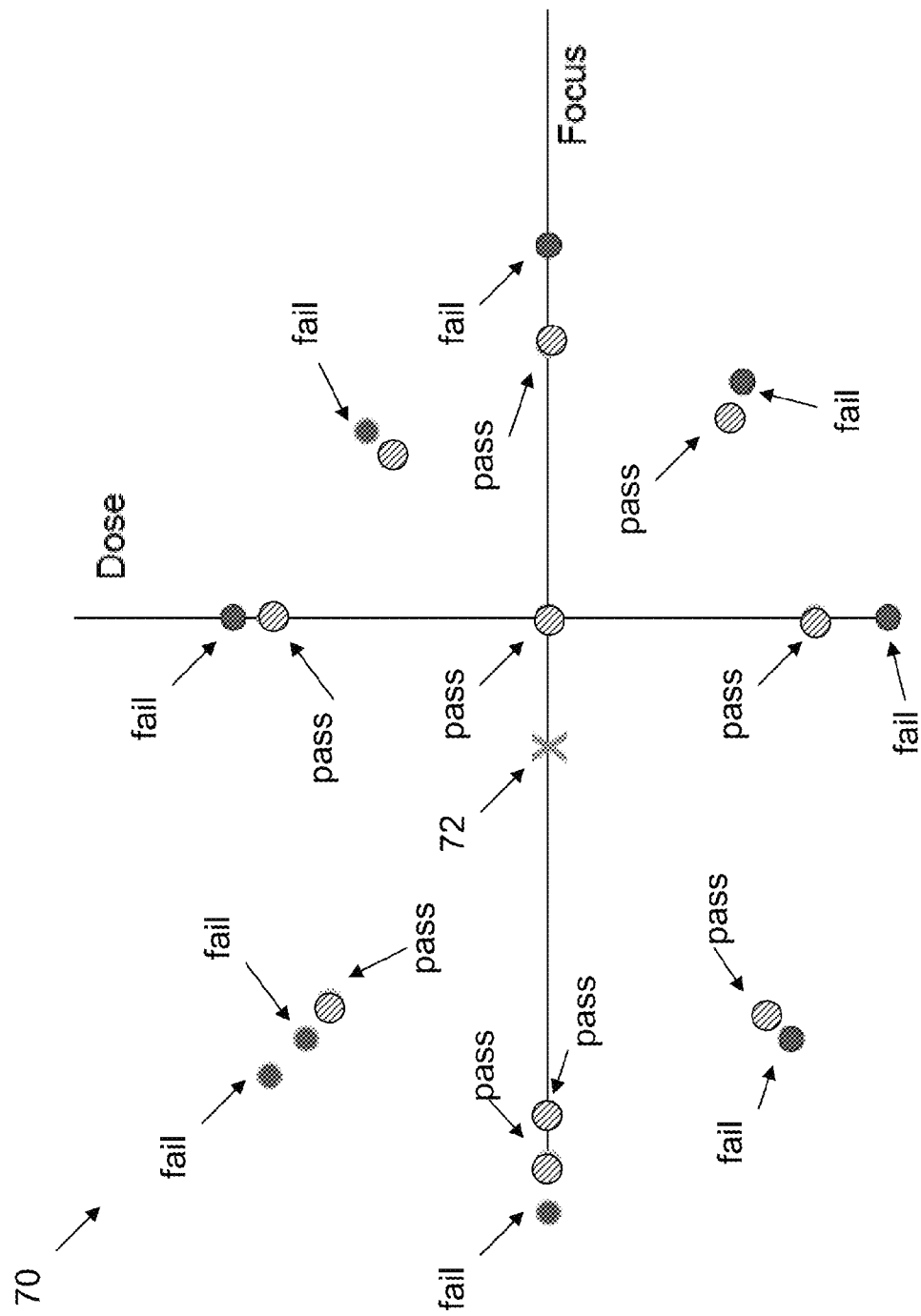

FIG. 7 shows a data plot 70 including the pass/fail points of FIG. 6, and further showing a lithography center point 72 chosen according to a centroid selection function. As is described herein, a centroid selection function may choose a locational center within the acceptable operating region 65 (FIG. 6) and designate that point as the lithograph center point 72.

Figure 8:
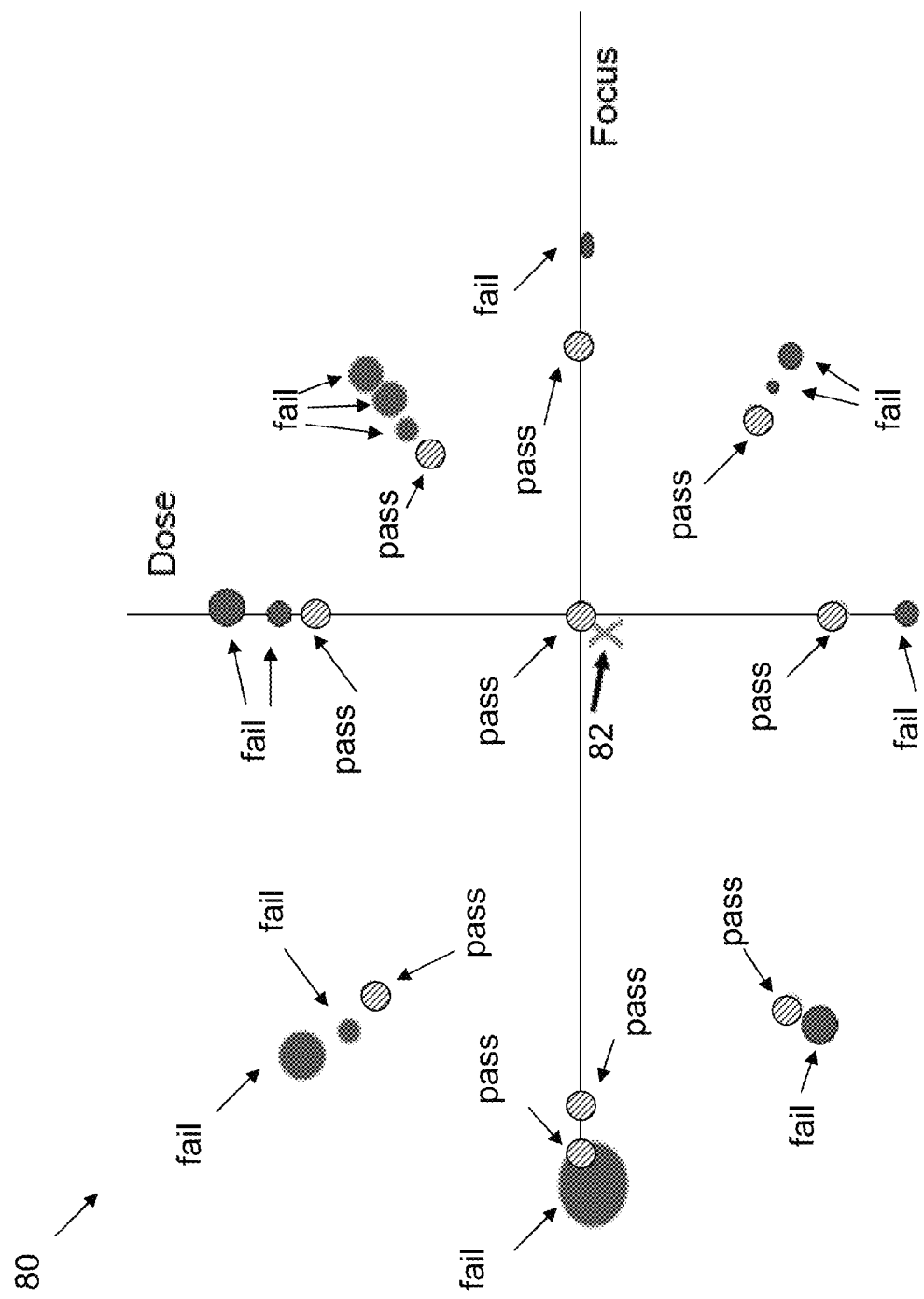

FIG. 8 shows a data plot 80 based upon the pass/fail points of data plot 60 (FIG. 6), including points enhanced due to a frequency selection function. In this case, the frequency selection function determines that a lithographic center point 82 should be closer to nominal than the lithography center point 72 (FIG. 7) shown and described with reference to the centroid selection function. In one example, the frequency selection function may determine the lithographic center point 82 by 1) creating a function that includes the distance of each failing point from X, where X is the center point 82; and 2) minimizing the summation of this function over all failing points. In FIG. 8, this example is schematically represented by showing circles of varying diameter, where the diameter size is based upon the number of failing IC structures at that process condition. In a more specific example, this method may be performed by minimizing the summation of $k(P\_n-X)^2$ where k is the number of points failing at process condition $P\_n$. In another embodiment, a polynominal format could be used as a frequency selection function, such as, e.g., $k^j(P\_n-X)^i$ where j and i represent values >0.

Figure 9:
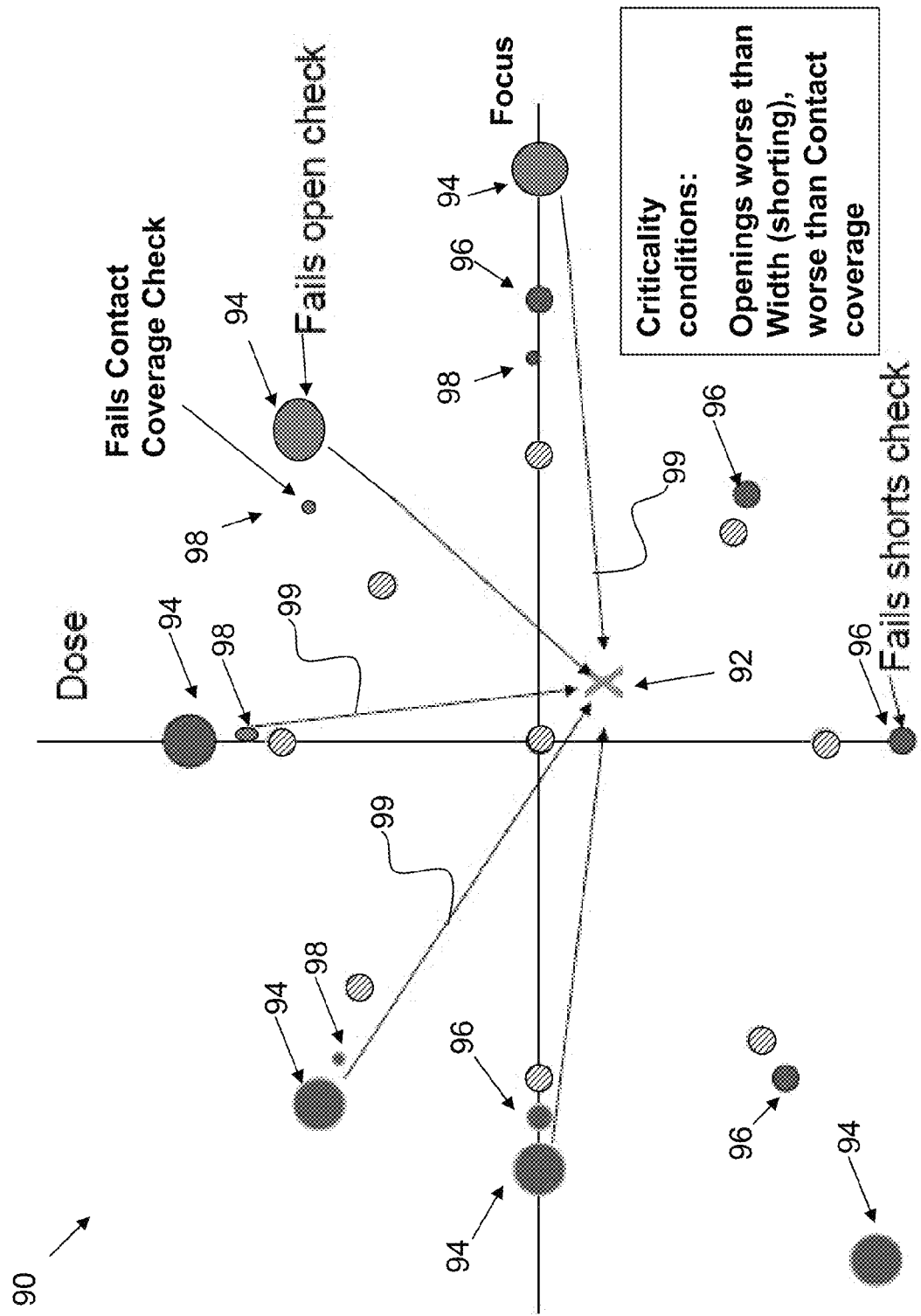

FIG. 9 shows a data plot 90 based upon the pass/fail points of data plot 60 (FIG. 6), including points enhanced due to a criticality function. In this example, certain criticality conditions may exist: for example, depending on the specific process used, line opening failures could be more critical than width (shorting) failures, which in turn could be more critical than contact coverage failures. As such, a lithographic center point 92 is determined based upon the presence of these types of failures, and the criticality of those failures with respect to each other. In this case, larger points 94 represent line opening failures, slightly smaller points 96 represent width (shorting) failures, and the smallest points 98 represent contact coverage failures. General measurement lines 99 indicate respective distances from line opening failure points 94 to the determined lithographic center point 92.

It is understood that in alternative embodiments, the acceptable operating region (e.g., acceptable operating region 65, FIG. 6) defined according to processes described herein, may be used to other manners to generate lithographic center points. For example, in one alternative embodiment, a process may include: simulating critical dimension measurements on the acceptable operating region through a range of process conditions (e.g., dose, focus, etc.); and then performing conventional exposure defocus (ED) window processing to determine a lithographic center point. In another alternative embodiment, critical dimension scanning electron microscopy (SEM) measurement may be taken on the acceptable operating region, followed by convention ED window processing.

Additionally, in other embodiments, mask bias may be optimized using the teachings described herein. For example, while the processes described herein were described with reference to post-OPC data (e.g., post-OPC data 12, FIG. 1), one alternative method may include setting target critical dimensions for the photomask; re-running OPC using varying mask bias (which will, e.g., drive a different dose in OPC/on wafer); measuring the acceptable operating region (as described herein); conducting a Monte Carlo analyses with process variables (e.g., dose, focus, etc.); choosing a selection function and weighting the probability of failures; and performing conventional exposure defocus (ED) window processing.

In yet another alternative embodiment, OPC may be optimized using the teachings described herein. For example, this method may include iteratively running OPC using varying dose and focus; measuring the acceptable operating region (as described herein) for each variance; selecting the OPC data set with the largest acceptable operating region; and choosing a dose and focus amount for manufacturing based upon the largest acceptable operating region.

It is further understood that the teachings described herein may be reticle-specific. Additionally, the teachings described herein may be chip-specific or stepper specific.

Figure 10:
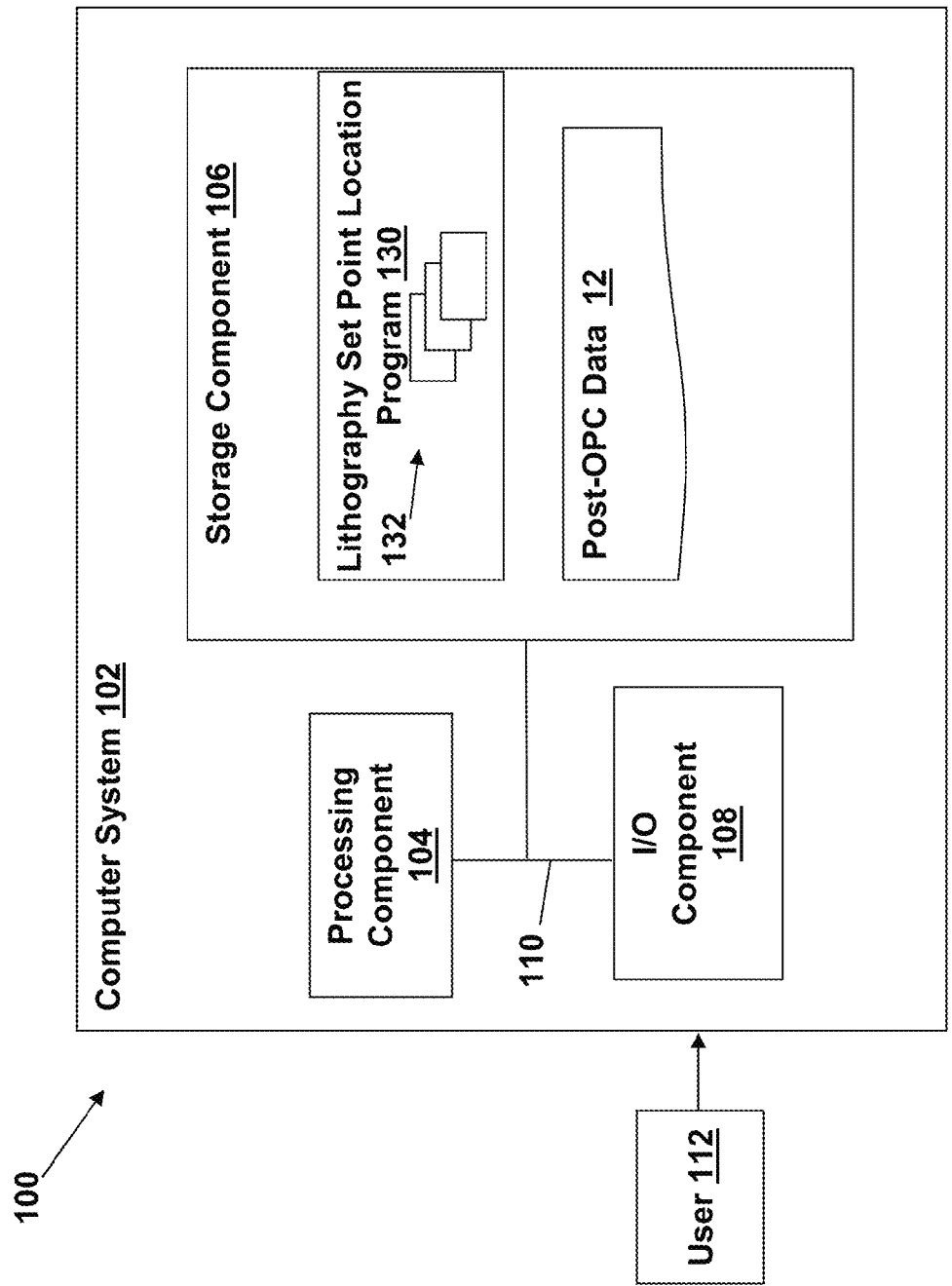
FIG. 10 shows an illustrative environment for determining a lithographic set point according to embodiments.

FIG. 10 depicts an illustrative environment 100 for determining a lithographic set point according to an embodiment. To this extent, the environment 100 includes a computer system 102 that can perform a process described herein in order to generate a cut mask in an integrated circuit design. In particular, the computer system 102 is shown as including a lithography set point location program 130, which makes computer system 102 operable to handle determining a lithographic set point by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the lithography set point location program 130, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a human user 112 to interact with the computer system 102 and/or one or more communications devices to enable a system user 112 to communicate with the computer system 102 using any type of communications link. To this extent, the lithography set point location program 130 can manage a set of interfaces (e.g., graphical user interface(s), application program interface, etc.) that enable human and/or system users 112 to interact with the lithography set point location program 130. Further, the lithography set point location program 130 can manage (e.g., store, retrieve, create, manipulate, organize, present, etc.) data, such as post-OPC data 12, etc., using any solution.

In any event, the computer system 102 can comprise one or more general purpose computing articles of manufacture (e.g., computing devices) capable of executing program code, such as the lithography set point location program 130, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the lithography set point location program 130 can be embodied as any combination of system software and/or application software.

Further, the lithography set point location program 130 can be implemented using a set of modules 132. In this case, a module 132 can enable the computer system 102 to perform a set of tasks used by the lithography set point location program 130, and can be separately developed and/or implemented apart from other portions of the lithography set point location program 130. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of lithography set point location program 130 fixed thereon (e.g., one or more modules 132). However, it is understood that the computer system 102 and lithography set point location program 130 are only representative of various possible equivalent computer systems that may perform a process described herein. To this extent, in other embodiments, the functionality provided by the computer system 102 and lithography set point location program 130 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as post-OPC data 12 using any solution. For example, the computer system 102 can generate and/or be used to generate post-OPC data 12, retrieve post-OPC data 12, from one or more data stores, receive post-OPC data 12a, from another system, send post-OPC data 12 to another system, etc.

While shown and described herein as a method and system for determining a lithographic set point, it is understood that aspects of the invention further provide various alternative embodiments. For example, in one embodiment, the invention provides a computer program fixed in at least one computer-readable medium, which when executed, enables a computer system to determine a lithographic set point. To this extent, the computer-readable medium includes program code, such as the lithography set point location program 130 (FIG. 8), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the lithography set point location program 130 (FIG. 10), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for determining a lithographic set point. In this case, a computer system, such as the computer system 102 (FIG. 10), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A computer-implemented method of determining a lithographic tool set point for a lithographic process, the method comprising:
   providing a model of a production lithographic process including simulations of printed shapes;
   analyzing the model of the production lithographic process to determine whether a set of structures on a production mask used in the production lithographic process to create the printed shapes will fail under a plurality of set points, wherein the analyzing includes:
      determining that a set point in the plurality of set points is a failure point;
      establishing the failure point as an outer limit for at least one process condition; and
      testing another set point in the plurality of set points within the outer limit to determine if the another set point is another failure point;
   determining an operating region of set points where the set of structures on the production mask does not fail; and
   establishing a set point location within the operating region based upon a set point selection function.

2. The computer-implemented method of claim 1, wherein the analyzing further includes moving the outer limit to the another set point in the case that the another set point is another failure point.

3. The computer-implemented method of claim 2, wherein the analyzing further includes iteratively repeating the determining of the set point, the establishing of the failure point as an outer limit, and the testing of the another set point to determine if the another set point is another failure point.

4. The computer-implemented method of claim 1, wherein the set point selection function includes at least one of the following: a centroid selection function, a frequency selection function, or a weighted criticality selection function.

5. A computer system comprising:
   at least one computing device configured to determine a lithographic tool set point for a lithographic process by performing actions comprising:
      providing a model of a production lithographic process including simulations of printed shapes;
      analyzing the model of the production lithographic process to determine whether a set of structures on a production mask used in the production lithographic process to create the printed shapes will fail under a plurality of set points, wherein the analyzing includes:
         determining that a set point in the plurality of set points is a pass point;
         establishing the pass point as an inner limit for at least one process condition; and
         testing another set point in the plurality of set points outside the inner limit to determine if the another set point is another pass point;
      determining an operating region of set points where the set of structures on the production mask does not fail; and
      establishing a set point location within the operating region based upon a set point selection function.

6. The computer system of claim 5, wherein the analyzing further includes:
   moving the inner limit to the another set point in the case that the another set point is another pass point; and
   iteratively repeating the determining of the set point, the establishing of the pass point as an inner limit, and the testing of the another set point to determine if the another set point is another pass point.

7. The computer system of claim 6, wherein the analyzing further includes iteratively repeating the determining of the set point, the establishing of the pass point as an inner limit, and the testing of the another set point to determine if the another set point is another pass point.

8. The computer system of claim 5, wherein the set point selection function includes at least one of the following: a centroid selection function, a frequency selection function, or a weighted criticality selection function.

9. A computer program comprising program code embodied in at least one non-transitory computer readable medium, which when executed, enables a computer system to implement a method for determining a lithographic tool set point for a lithographic process, the method comprising:

provide a model of a production lithographic process including simulations of printed shapes;

analyzing the model of the production lithographic process to determine whether a set of structures on a production mask used in the production lithographic process to create the printed shapes will fail under a plurality of set points, wherein the analyzing includes:

determining that a set point in the plurality of set points is a failure point;

establishing the failure point as an outer limit for at least one process condition; and testing another set point in the plurality of set points within the outer limit to determine if the another set point is another failure point;

determining an operating region of set points where the set point of structures on the production mask does not fail; and establishing a set point location within the operating region based upon a set point selection function.

10. The computer system of claim 9, wherein the analyzing further includes:

moving the outer limit to the another set point in the case that the another set point is another failure point; and iteratively repeating the determining of the set point, the establishing of the failure point as an outer limit, and the testing of the another set point to determine if the another set point is another failure point.

11. The computer system of claim 9, wherein the set point selection function includes at least one of the following: a centroid selection function, a frequency selection function, or a weighted criticality selection function.

* * * * *